United States Patent
Kim et al.

(10) Patent No.: US 8,296,499 B2
(45) Date of Patent: Oct. 23, 2012

(54) FLASH MEMORY DEVICE AND PROGRAM METHOD THEREOF

(75) Inventors: You-Sung Kim, Seoul (KR); Byung-Ryul Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1011 days.

(21) Appl. No.: 11/950,303

(22) Filed: Dec. 4, 2007

(65) Prior Publication Data

US 2009/0031080 A1    Jan. 29, 2009

(30) Foreign Application Priority Data

Jul. 25, 2007    (KR) .................. 10-2007-0074548

(51) Int. Cl.
 *G06F 12/00* (2006.01)
(52) U.S. Cl. ................ 711/103; 711/E12.008
(58) Field of Classification Search .................. 711/103
 See application file for complete search history.

(56) References Cited

U.S. PATENT DOCUMENTS

| | | | |
|---|---|---|---|
| 5,237,535 A * | 8/1993 | Mielke et al. ............ 365/185.3 |
| 5,579,502 A * | 11/1996 | Konishi et al. .............. 711/103 |
| 5,805,501 A * | 9/1998 | Shiau et al. ............. 365/185.29 |
| 6,272,052 B1 * | 8/2001 | Miyauchi ................. 365/185.33 |
| 6,434,658 B1 * | 8/2002 | Fukuzumi .................... 711/103 |
| 6,795,890 B1 * | 9/2004 | Sugai et al. .................... 711/103 |
| 7,164,616 B2 * | 1/2007 | Miller et al. ............. 365/230.06 |
| 2004/0090847 A1 * | 5/2004 | Takeuchi et al. ............. 365/200 |
| 2007/0133308 A1 * | 6/2007 | Matsubara et al. ....... 365/185.33 |

FOREIGN PATENT DOCUMENTS

KR    100732631 B1    6/2007

* cited by examiner

*Primary Examiner* — Edward Dudek, Jr.
*Assistant Examiner* — Christopher Birkhimer
(74) *Attorney, Agent, or Firm* — Kilpatrick Townsend & Stockton LLP

(57) ABSTRACT

A flash memory device includes a memory cell array, a peri circuit unit, an I/O controller, and a controller. The memory cell array includes a plurality of memory cells respectively connected to a plurality of bit line pairs and a plurality word lines. The peri circuit unit is configured to program data into the memory cell array or read data stored in the memory cell array in response to a command input through a control bus. The I/O controller is configured to receive data for programming and supply the data to the peri circuit unit in response to a command provided through a data input/output (I/O) bus. The controller is configured to control the I/O controller to perform a voltage setup operation for a program while the data for program is received.

12 Claims, 4 Drawing Sheets

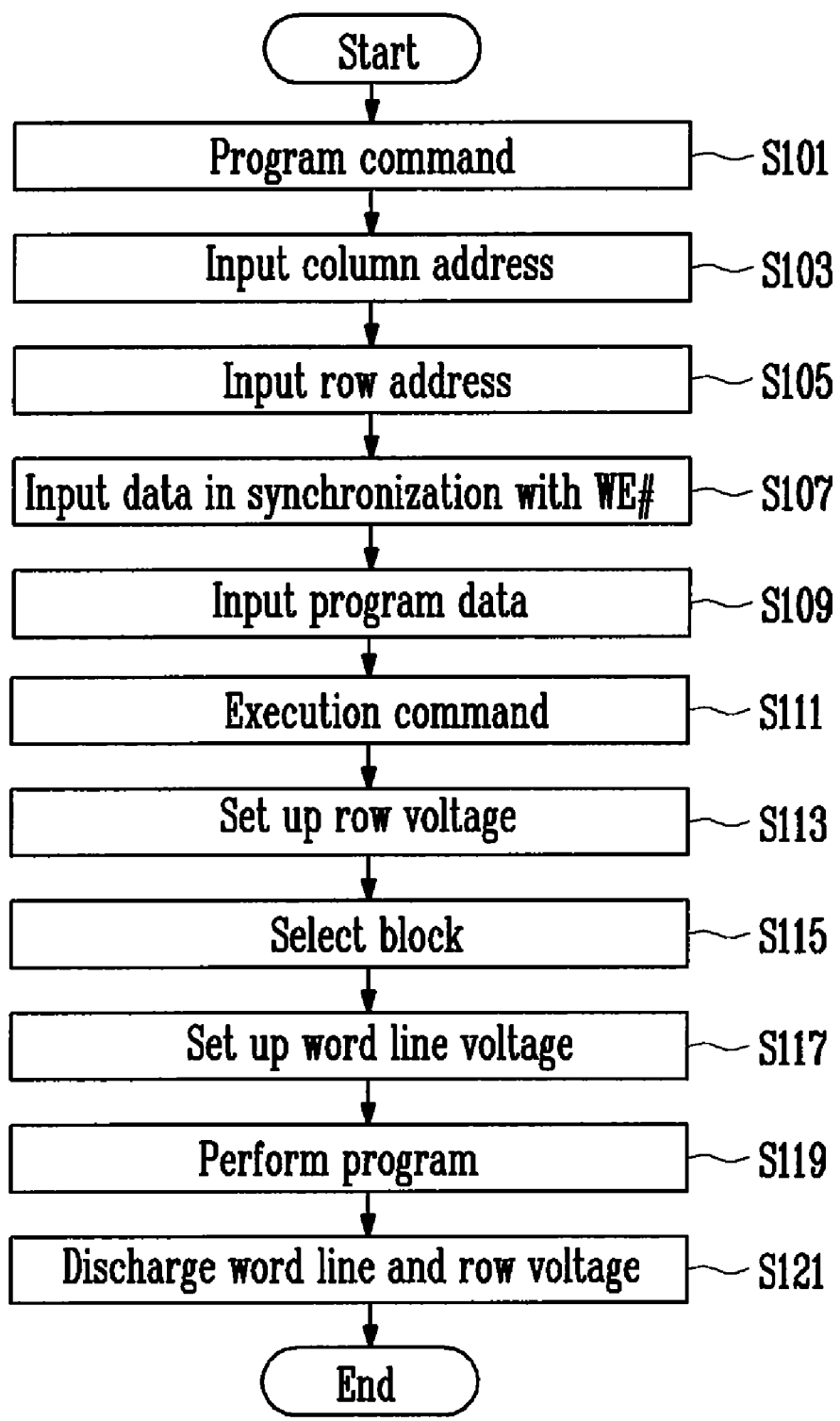

FLASH MEMORY DEVICE AND PROGRAM METHOD THEREOF

CROSS-REFERENCES TO RELATED APPLICATIONS

The present application claims priority to Korean patent application number 10-2007-74548, filed on Jul. 25, 2007, which is incorporated by reference in its entirety.

BACKGROUND OF THE INVENTION

The present invention relates to voltage setting for an operation of a flash memory device and, more particularly, to a flash memory device in which a row voltage is set according to a program command and a program method thereof.

In semiconductor memory devices, in particular, flash memory devices that enable electrical erasure and programming, Fowler-Nordheim (F-N) tunneling and hot electron injection methods are employed in order to perform an erase operation for erasing data stored in a memory cell and a program operation for storing data in the memory cell.

In order to program data into a memory cell, a hot electron injection method is used. In a hot electron injection method, electrons of a channel region adjacent to the drain region of the memory cell are injected into a floating gate of the memory cell. A high voltage for program is applied to the control gate of the memory cell. A high voltage for the operation of a flash memory device generally ranges from 15V to 20V. In general, a flash memory device operating at a low power supply voltage includes a voltage supply circuit for generating a high voltage. The voltage supply circuit is included within the same chip as the flash memory device. The voltage supply circuit is generally configured to pump an input row voltage as a high voltage by employing a voltage pumping circuit.

FIG. 1A is a flowchart illustrating a conventional program operation of a program voltage.

Referring to FIG. 1A, a flash memory device receives a program command code (80$h$) from an input/output (I/O) terminal for a program operation in step S101, and sequentially receives a column address and a row address in steps S103 and S105. The flash memory device then receives data in synchronization with a write enable signal (WE#) in step S107.

The data, input in step S107, is input to a page buffer connected to a memory cell for program in step S109. If an execution command code 10$h$ is input in step S111, the flash memory device begins operating.

In step S113, a row voltage is set up using the row address input in step S105. After a block is selected in step S115, a word line voltage is set up in step S117.

The row address includes a block address and a word line address. Thus, a program voltage, which will be set in a word line to be programmed, is set up using the row address, and an operation for setting up a pass voltage is performed on the remaining word lines.

If voltage setup for program is completed, the program operation is performed in step S119. If the program is completed, the word line and the row voltage are discharged in step S121.

A timing diagram according to the above operation is illustrated in FIG. 1B.

FIG. 1B is a timing diagram according to the operation of FIG. 1A.

Referring to FIG. 1B, when the flash memory device performs the program operation, it receives the program command code (80$h$), the column address, and the row address through I/O in steps S101 to S105 and then receives data in synchronization with the write enable signal (WE#). After all of the data is input, a program is performed after a time (tWB) for voltage setup.

Accordingly, a program time is lengthened as long as the voltage setup time is performed after the data is input.

BRIEF SUMMARY OF THE INVENTION

The present invention is directed toward a flash memory device, in which a process of receiving a row address and performing voltage setup is performed simultaneously with data input when a program of the flash memory device is performed, and a program method thereof.

In one embodiment, a flash memory device includes a memory cell array, a peri circuit unit, an I/O controller, and a controller. The memory cell array includes a plurality of memory cells respectively connected to a plurality of bit line pairs and a plurality word lines. The peri circuit unit is configured to program data into the memory cell array or read data stored in the memory cell array in response to a command input through a control bus. The I/O controller is configured to receive data for program and supply the data to the peri circuit unit in response to a command provided through a data input/output (I/O) bus. The controller is configured to control the I/O controller to perform a voltage setup operation for a program while the data for program is received.

The peri circuit unit includes an decoder for selecting the word lines of the memory cell array according to an address input through the I/O controller, a voltage supply unit for providing an operating voltage for programming or reading data into or from the memory cells, a plurality of page buffer circuits corresponding to the plurality of bit line pairs and configured to program or read data into or from the memory cells, and Y decoder circuits corresponding to the plurality of page buffer circuits and a data I/O line, and configured to transmit the data for program to the page buffer circuits or read data, transmitted from the page buffer circuits, to the data I/O line.

The I/O controller receives a program operation command code, address information of a memory cell on which program will be performed, and data to be programmed into the memory cell, for performing a program operation.

The address information includes column address information and row address information.

The controller controls voltage setup for the program operation using the address information received by the I/O controller.

The voltage setup operation is controlled to perform row voltage and word line voltage setup using row address information included in the address information.

In another embodiment, a method of programming a flash memory device, includes receiving column and row addresses in response to a program command; storing data for program in a page buffer in response to a write enable bar signal, while the data for program is stored in the page buffer beginning from a point where a row address is input; performing row voltage setup, block selection, and word line voltage setup; and after performing the voltage setup and storing the data for program in the page buffer, performing a program operation.

The reception of the address information includes receiving a column address of a memory cell for a program, and receiving a row address of the memory cell.

The voltage setup operation includes setting up a row voltage using the row address, selecting a block including the memory cell for the program, and setting up a word line voltage of the memory cell using the row address.

The method further includes discharging the setup voltage after the program operation is completed.

BRIEF DESCRIPTION OF THE DRAWINGS

FIG. 1A is a flowchart illustrating a conventional program operation of a program voltage;

DESCRIPTION OF SPECIFIC EMBODIMENTS

A specific embodiment according to the present invention will be described with reference to the accompanying drawings.

Figure 1B:
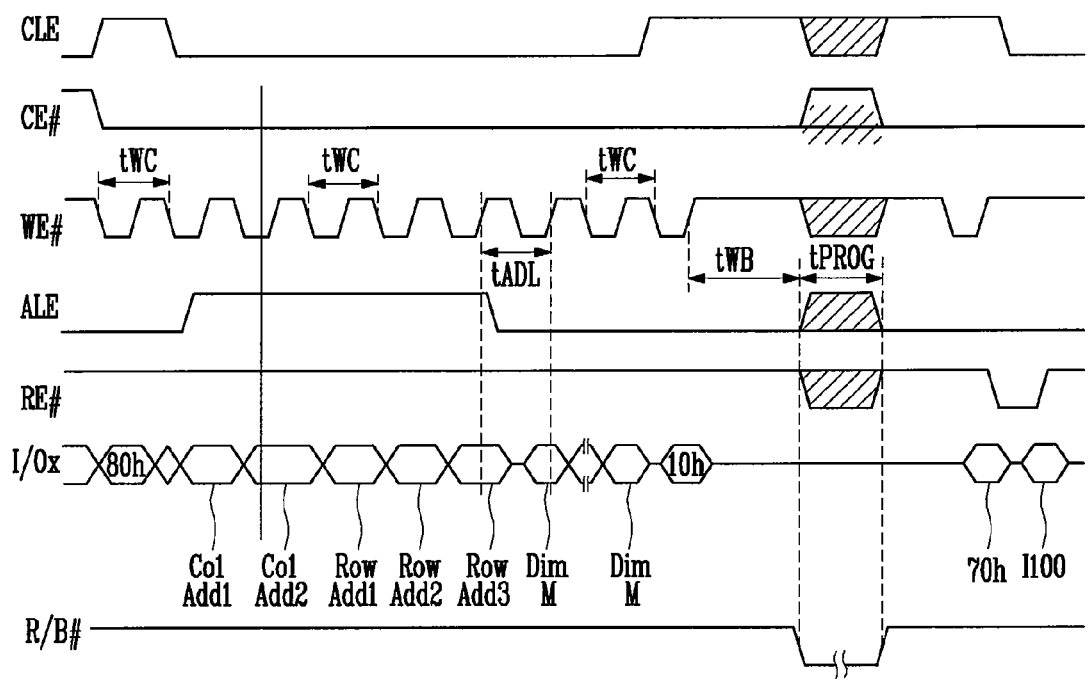
FIG. 1B is a timing diagram according to the operation of FIG. 1A.
Figure 2:
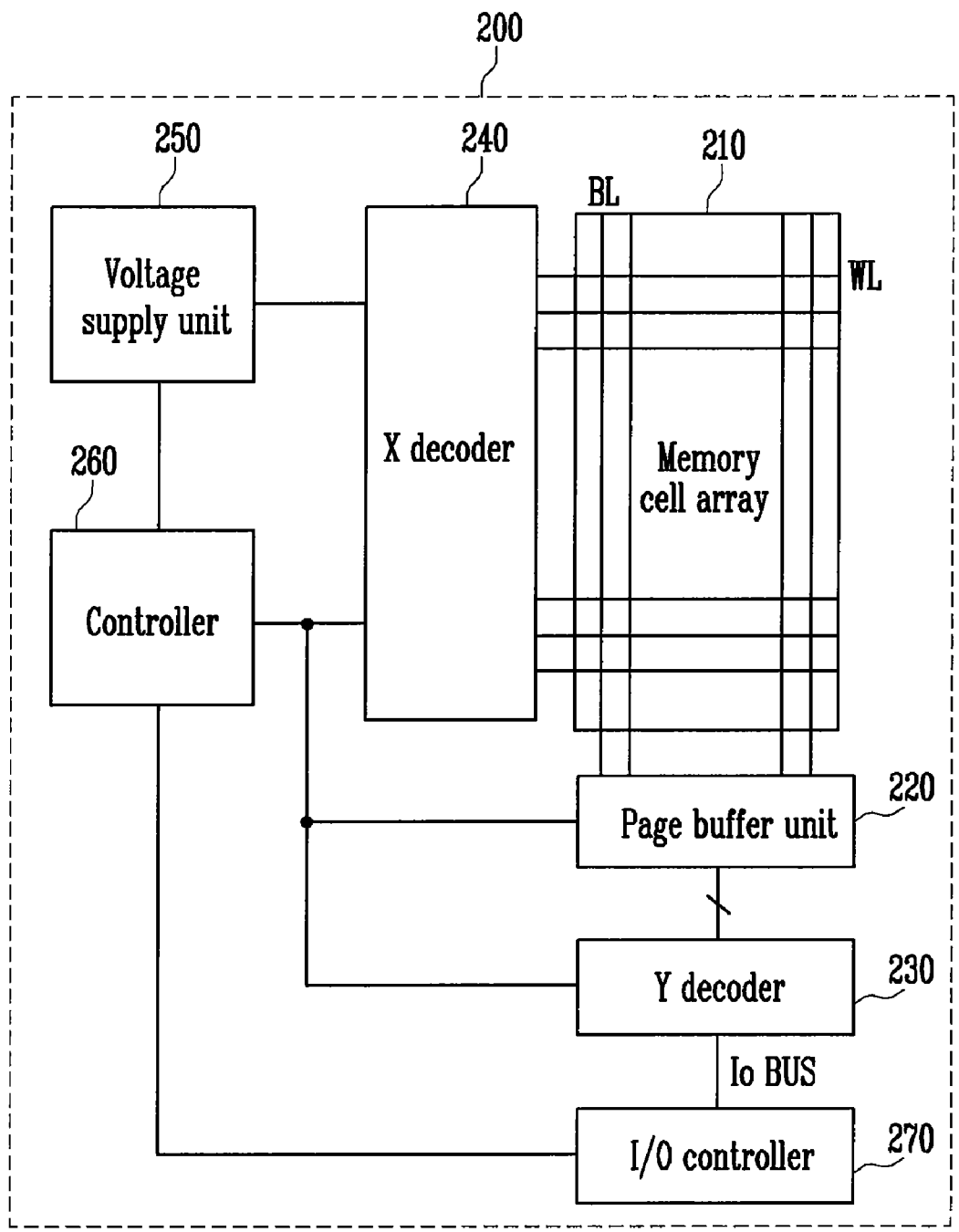
FIG. 2 is a block diagram of a flash memory device.

FIG. 2 is a block diagram of a flash memory device.

Referring to FIG. 2, a flash memory device 200 according to an embodiment of the present invention includes a memory cell array 210 in which a plurality of memory cells for storing data comprise word lines and bit lines, a page buffer unit 220 for programming data into the memory cell array 210 or reading data stored in the memory cell array 210, a Y decoder 230 for selecting the page buffer unit 220 according to an input address, an X decoder 240 for selecting the word lines of the memory cell array 210 according to an input address, a voltage supply unit 250 for generating an operating voltage for the operation of the flash memory device 200, a controller 260 for outputting a control signal for the operation of the flash memory device 200, and an I/O controller 270 for receiving an operating command and data from an external source or outputting programmed data.

The memory cell array 210 includes the plurality of memory cells (not shown) capable of storing data. The memory cells are arranged by the bit lines (BL) and the word lines (WL).

The page buffer unit 220 includes a plurality of page buffer circuits. The page buffer circuits are connected to the bit line pairs of the memory cell array 210, respectively, and perform an operation of programming/reading data into/from the memory cells of the bit lines connected thereto.

The Y decoder 230 provides a data I/O path with the plurality of page buffer circuits of the page buffer unit 220 according to the control signal. The X decoder 240 selects the word lines according to an input address.

The I/O controller 270 receives an operating command code, data, etc., from an external system connected to the flash memory device 200, transfers the received information to the page buffer unit 220 through the Y decoder 230, or controls a data I/O operation of outputting data, which is read from the memory cell array 210 by the page buffer unit 220, to an external destination.

The I/O controller 270 is connected to the Y decoder 230 and the controller 260 through a data I/O bus.

The voltage supply unit 250 generates voltages necessary for the operation of the flash memory device 200, and supplies generated voltages to the flash memory device 200. The voltage supply unit 250 generates a predetermined level of voltage by performing a pumping operation before a power source is applied to the flash memory device 200 and power-up begins or before the flash memory device 200 is in an idle state.

The controller 260 outputs the control signal to control the operation of the flash memory device 200. A control bus is also connected between the page buffer unit 220 and the Y decoder 230 and between the X decoder 240 and the voltage supply unit 250. Thus, the controller 260 outputs a signal for operation control through the control bus. While the I/O controller 270 receives data, the controller 260 may control other function blocks through an additional control bus.

An operation in which the flash memory device 200 operates according to a received program command is described below.

Figure 3:
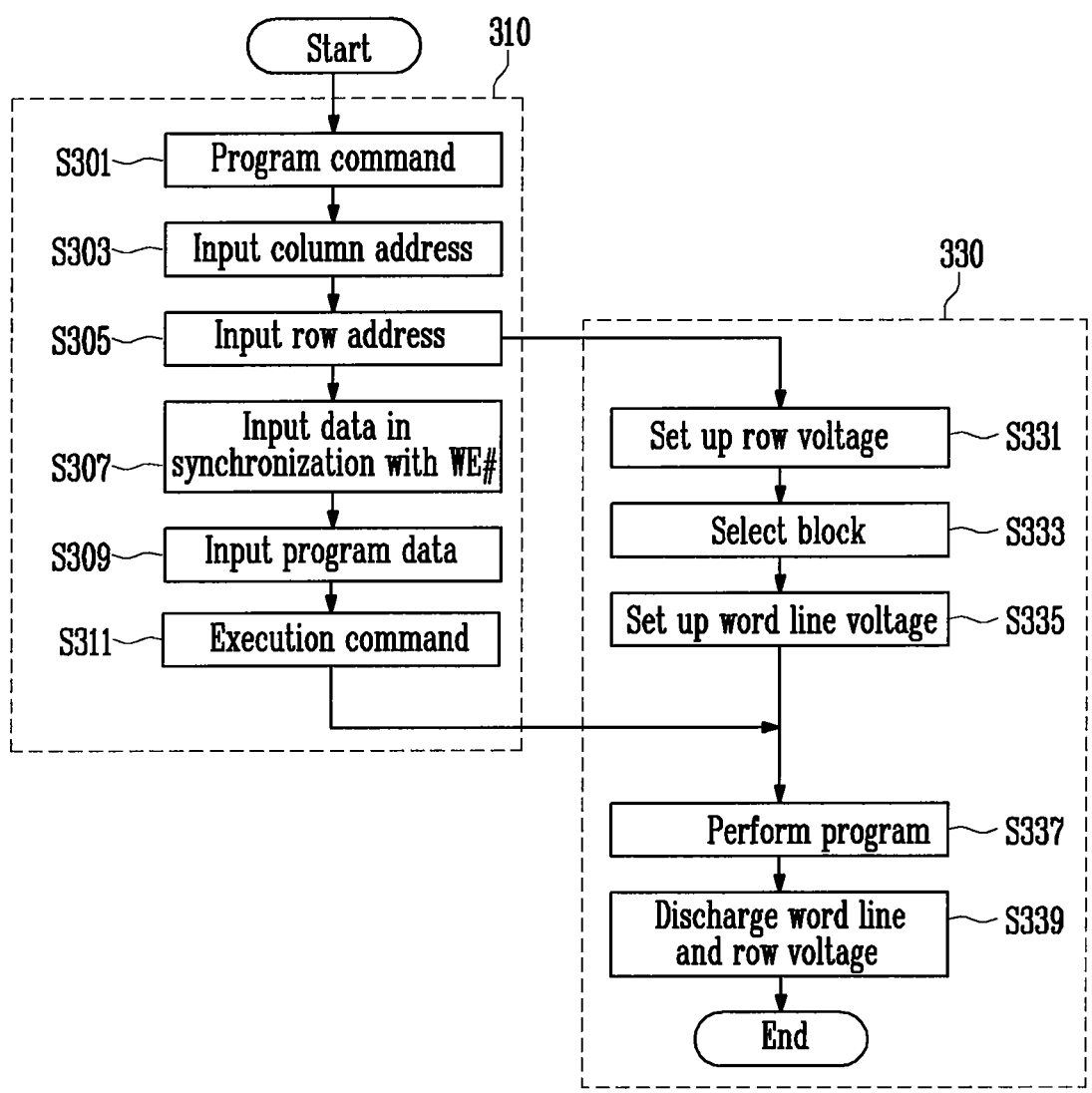
FIG. 3 is a flowchart illustrating a program operation according to an embodiment of the present invention.

FIG. 3 is a flowchart illustrating a program operation according to an embodiment of the present invention.

The program operation of FIG. 3 is described in detail below referring to the flash memory device 200 of FIG. 2 as an example.

A program command code (80h) is received from an external source through the I/O controller 270 in step S301, and a column address and a row address for program are received in steps S303 and S305.

The I/O controller 270 receives data for program in synchronization with a write enable signal (WE#) in step S307. The data received by the I/O controller 270 is input to the page buffer circuit of the page buffer unit 220 through the Y decoder 230 in step S309.

If all of the data is input, the I/O controller 270 receives a program execution command code (10h) in step S311.

In steps S301 to S311, the operation of receiving the command code, the addresses, and the data from an external source through the data I/O bus connected to the I/O controller 270 of the flash memory device 200 is performed.

While the data I/O bus receives the data, the controller 260 performs a voltage setting operation using the row address, input in step S305, through the control bus.

The row address includes a word line address, an even or odd bit line address, and a block address. When a memory cell is a multi-level cell, the row address also includes a logical page address.

In other words, the controller 260 controls the X decoder 240 and the voltage supply unit 250 to set up a row voltage using the row address, input in step S305, in step S331. After a block is selected in step S333, the controller 260 sets up a word line voltage in step S335.

Setting up the row voltage in step S331 sets up the voltage supply unit 250 so that the controller 260 generates high voltages, such as a program voltage, a pass voltage, and a verification voltage, which will be provided to the word lines, according to a program operation command.

Selecting the block in step S333 selects a block, which will be programmed, using a block address included in a row address. Setting up the word line voltage in step S335 provides the word lines with the voltages generated by the voltage supply unit 250 in step S331. The word lines selected using the word line address included in the row address are supplied with a program voltage, and unselected word lines are supplied with a pass voltage.

After the step S305, while the steps S307 to S311 are performed through the data I/O bus and the I/O controller 260, the controller 260 controls the X decoder 240 and the voltage supply unit 250 so that the steps S331 to S335 are executed. As mentioned earlier, the controller 260 controls the X decoder 240 and the voltage supply unit 250 through the control bus.

To this end, the data I/O bus and the control bus used for data input are separated from each other.

In FIG. 3, a block 310 is a part in which the I/O controller 270 performs the operation of receiving and transferring data through the data I/O bus, and a block 330 is a part in which the controller 260 controls the operation of the flash memory device 200 using the control bus.

If the word line voltage is set up in step S335 and the I/O controller 270 receives the execution command code (10h) in step S311 after receiving all of the data to be programmed, the program operation is performed in step S337. After the program is completed, the word lines and the row voltage are discharged, finishing the operation in step S337.

End times of the steps S335 and S311 are set. After the steps S335 and S311 are completed, the program operation of the step S337 can be performed. The program operation complies with an operation in which a general flash memory device programs data through the page buffer unit 220, and will not be described further.

Accordingly, a program time can be shortened through this operation because a row voltage and a word line voltage are set up while data is received.

As described above, in accordance with the flash memory device and the program method thereof according to the present invention, a process for data input and a voltage setup program for program are separately performed at the same time. Accordingly, a standby time can be reduced and a program time can be shortened.

Although the foregoing description has been made with reference to a specific embodiment, it is to be understood that changes and modifications to the present invention may be made by one having ordinary skill in the art without departing from the spirit and scope of the present invention and appended claims.

What is claimed is:

1. A flash memory device comprising:
a memory cell array comprising a plurality of memory cells respectively connected to a plurality of bit line pairs and a plurality word lines;
an I/O controller configured to receive data for programming in response to a command provided through a data input/output (I/O) bus;
a controller configured to output a control signal for performing a voltage setup operation for a program operation through a control bus while the data for programming is being received by the I/O controller, the voltage setup operation including the setup of a word line voltage; and
a peri circuit unit configured to program data into the memory cell array or reading data stored in the memory cell array in response to the control signal.

2. The flash memory device of claim 1, wherein the peri circuit unit comprises:
a X decoder for selecting the word lines of the memory cell array according to an address input through the I/O controller;
a voltage supply unit for performing a voltage setup operation and providing an operating voltage for programming data into the memory cells or reading data from the memory cells;
a plurality of page buffer circuits corresponding to the plurality of bit line pairs, the page buffer circuits being configured to program data into the memory cells or read data from the memory cells; and
Y decoder circuits corresponding to the plurality of page buffer circuits and a data I/O line, the Y decoder circuits being configured to transmit the data for program to the page buffer circuits or read data to the data I/O line, wherein the read data is received from the page buffer circuits.

3. The flash memory device of claim 1, wherein the I/O controller receives a program operation command code, address information of a memory cell on which a program will be performed, and data to be programmed into the memory cell.

4. The flash memory device of claim 3, wherein the address information includes column address information and row address information.

5. The flash memory device of claim 3, wherein the controller controls voltage setup for the program operation using the address information received by the I/O controller.

6. The flash memory device of claim 5, wherein the voltage setup operation is controlled to perform row voltage and word line voltage setup using row address information included in the address information.

7. A method of programming a flash memory device, the method comprising:
receiving address information comprising column and row addresses in response to a program command;
performing a voltage setup operation including row voltage setup, block selection, and word line voltage setup according to the row address and storing data for programming in a page buffer while the voltage setup operation is performed in response to a write enable bar signal; and
after performing the voltage setup operations and storing the data for programming in the page buffer, performing a program operation.

8. The method of claim 7, wherein performing the voltage setup operation includes:
setting up a row voltage using the row address;
selecting a block including the memory cell for the program; and
setting up a word line voltage of the memory cell using the row address.

9. The method of claim 7, further comprising discharging the setup voltage after performing the program operation.

10. A flash memory device comprising:
a memory cell array comprising a plurality of memory cells respectively connected to a plurality of bit line pairs and a plurality of word lines;
an I/O controller configured to receive data for programming in response to a command provided through a data input/output (I/O) bus;
a controller configured to output a control signal for performing a voltage setup operation for a program operation through a control bus while the data for programming is being received by the I/O controller, the voltage setup operation including the setup of a word line voltage;
a voltage supply unit configured to generate an operating voltage for programming data into the memory cell array or reading data stored in the memory cell array by performing the voltage setup operation in response to the control signal; and
a peri circuit unit configured to program data transferred by the I/O controller into the memory cell array or reading data stored in the memory cell array in response to the operating voltage.

11. The flash memory device of claim 10, wherein the controller outputs the control signal using address information received by the I/O controller.

12. The flash memory device of claim 11, wherein the generation of the operating voltage is controlled to perform row voltage and word line voltage setup using row address information included in the address information received by the I/O controller.

* * * * *